(12) United States Patent
Azuma et al.

(10) Patent No.: US 6,649,462 B2
(45) Date of Patent: Nov. 18, 2003

(54) SEMICONDUCTOR DEVICE AND METHOD OF MANUFACTURING THE SAME INCLUDING T-SHAPED GATE

(75) Inventors: Atsushi Azuma, Yokohama (JP); Satoshi Matsuda, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/292,579

(22) Filed: Nov. 13, 2002

(65) Prior Publication Data

US 2003/0073273 A1 Apr. 17, 2003

Related U.S. Application Data

(62) Division of application No. 09/986,362, filed on Nov. 8, 2001.

(30) Foreign Application Priority Data

Jul. 24, 2001 (JP) ........................................ 2001-223392

(51) Int. Cl.[7] .................. H01L 21/8238; H01L 21/336; H01L 21/425; H01L 21/3205; H01L 21/337
(52) U.S. Cl. ...................... 438/231; 438/187; 438/305; 438/232; 438/527; 438/595; 438/766; 438/926
(58) Field of Search ............................. 438/183, 230, 438/231, 232, 296, 301, 303, 305, 306, 527, 595, 766, 926

(56) References Cited

U.S. PATENT DOCUMENTS

| | | | |
|---|---|---|---|
| 5,580,803 A | | 12/1996 | Oh et al. |
| 5,966,597 A | | 10/1999 | Wright |
| 5,985,726 A | * | 11/1999 | Yu et al. ..................... 438/301 |
| 6,054,355 A | * | 4/2000 | Inumiya et al. .............. 438/296 |
| 6,140,169 A | | 10/2000 | Kawai et al. |
| 6,214,670 B1 | | 4/2001 | Shih et al. |
| 6,294,481 B1 | * | 9/2001 | Inumiya et al. .............. 438/766 |
| 6,307,245 B1 | | 10/2001 | Kunii et al. |
| 6,376,888 B1 | * | 4/2002 | Tsunashima et al. ........ 257/407 |

OTHER PUBLICATIONS

Matsuda et al.; "Performance Improvement of Metal Gate CMOS Technologies"; Symposium on VLSI Technology Digest of Technical Papers, pp. 63–64, 2001.
Yagishita et al.; "High Performance Metal Gate MOSFETs Fabricated by CMP For 0.1 $\mu$m Regime"; IEDM Technical Digest, pp. 785–788, 1998.
Chatterjee et al.; "Sub–100nm Gate Length Metal Gate NMOS Transistors Fabricated by a Replacement Gate Process"; IEDM Technical Digest, pp. 821–824, 1997.
Ghani et al.; "100 nm Gate Length High Performance/Low Power CMOS Transistor Structures"; IEDM Technical Digest, pp. 415–418, 1999.

* cited by examiner

Primary Examiner—John F. Niebling
Assistant Examiner—Ron Pompey
(74) Attorney, Agent, or Firm—Finnegan, Henderson, Farabow, Garrett & Dunner, L.L.P.

(57) ABSTRACT

A gate insulating film is provided on a channel region. A gate electrode includes a lower part and an upper part. The lower part has a lower surface and sides, and the upper part has a lower surface. The lower surface of the lower part contacts the gate insulating film. The upper part is longer than the lower part in a lengthwise direction of a gate electrode. The first insulating film is interposed between the lower surface of the upper part of the gate electrode and a semiconductor substrate. The first insulating film surrounds at least the sides of the lower part of the gate electrode, which face drain and source regions, and having parts interposed between the lower surface of the upper part of the gate electrode and the semiconductor substrate and made thicker than the other parts.

9 Claims, 4 Drawing Sheets

SEMICONDUCTOR DEVICE AND METHOD OF MANUFACTURING THE SAME INCLUDING T-SHAPED GATE

This is a division of application Ser. No. 09/986,362 filed Nov. 8, 2001.

CROSS-REFERENCE TO RELATED APPLICATIONS

This application is based upon and claims the benefit of priority from the prior Japanese Patent Application No. 2001-223392, filed Jul. 24, 2001, the entire contents of which are incorporated herein by reference.

BACKGROUND OF THE INVENTION

1. Field of the Invention

The present invention relates to a semiconductor device that comprises a semiconductor substrate and an insulated gate field-effect transistor (MISFET) provided on the substrate, and to a method of manufacturing the semiconductor device. The invention relates to the gate electrode of a MISFET, which is made of metal, and to a method of manufacturing the gate electrode.

2. Description of the Related Art

In a method of manufacturing a MOSFET whose gate electrode is made of metal, the metal gate is formed by damascene metal-gate process. In the damascene metal-gate process, the trench made by removing a dummy gate is filled with metal. The smaller and narrower the metal gate of the MOSFET, the more difficult it is to fill the trench with metal. Therefore, there is a demand for a MOSFET structure and a method, with which damascene metal-gate process can be successfully performed even if the metal gate is small and narrow.

FIGS. 1A and 1B are sectional views, explaining damascene metal-gate process of forming the gate electrode of a conventional MOSFET.

In this damascene metal-gate process, a dummy gate (not shown) is removed, making a trench 90 in an inter-layer insulating film 95 as shown in FIG. 1A. Thereafter, as FIG. 1B shows, metal 96 is deposited on the film 95 and in the trench 90. In FIGS. 1A and 1B, numeral 91 designates a dummy-gate insulating film, numeral 92 indicates a silicon nitride film that surrounds the trench 90, numeral 93 denotes a gate side-wall (silicon oxide film), numeral 94 represents a silicon nitride film, and numeral 97 denotes a gate insulating film.

The MOSFET is so small that its channel length is, for example, 30 nm and the trench 90 has a height of, for example, 220 nm, as is illustrated in FIGS. 1A and 1B. The trench 90 therefore has a very large aspect ratio. Due to the large aspect ratio, the trench 90 cannot be completely filled with metal 96 if the metal 96 is deposited by sputtering. Consequently, a space S is made in the trench 90.

To fill the trench 90 with metal 96 fully and completely, the height of the dummy gate may be decreased. However, the height of the dummy gate cannot be easily reduced, because it is also used the dummy gate as a polishing stopper of the inter-layer insulating film 95 by chemical mechanical polishing (CMP).

If the trench 90 is made narrower so that it may be filled with metal 96 completely, the metal 96 will form a metal gate that has but a small cross section. The metal gate inevitably has an excessively high resistance, jeopardizing the high performance of the MOSFET. The trench 90 may be broadened. If the trench 90 is broadened, however, the MOSFET will have a long gate length, which also impairs the performance of the MOSFET.

As described above, the conventional damascene metal-gate process is disadvantageous because it is difficult to fill up a trench with metal to form the metal gate of a MOSFET particularly when the metal gate is small and narrow. If the trench is made shallow so as to be completely filled with metal, the resultant meal gate will have a high resistance, jeopardizing the high performance of the MOSFET. If the trench is broadened for the same objective, the gate length will increase, inevitably impairing the performance of the MOSFET.

BRIEF SUMMARY OF THE INVENTION

According to one aspect of the present invention, there is provided a semiconductor device semiconductor device which comprises: a semiconductor substrate; at least one pair of impurity-diffused layers formed in a surface of the semiconductor substrate, isolated from each other and constituting a drain region and a source region of an insulated gate field-effect transistor; a channel region provided between the drain region and the source region; a gate insulating film provided on the channel region; a gate electrode including a lower part and an upper part, the lower part having a lower surface and sides, the upper part having a lower surface, the lower surface of the lower part contacting the gate insulating film, and the upper part being longer than the lower part in a lengthwise direction of the gate electrode; and a first insulating film interposed between the lower surface of the upper part of the gate electrode and the semiconductor substrate, surrounding at least the sides of the lower part of the gate electrode, which face the drain and source regions, and having parts located adjacent to the sides of the lower part of the gate electrode and having a height greater than a thickness of the other parts located between the lower surface of the upper part of the gate electrode and the semiconductor substrate.

According to another aspect of the invention, there is provided a method of manufacturing a semiconductor device, the method comprises: preparing a semiconductor substrate; forming a dummy-gate insulating film and a dummy gate having a circumferential surface, on a region of the semiconductor substrate, in which an insulated gate field-effect transistor will be formed; introducing an impurity into a surface of the semiconductor substrate selectively, thereby forming a drain region and a source region of the insulated gate field-effect transistor and forming a channel region between the drain region and the source region; forming a first insulating film on the circumferential surface of the dummy gate, the first insulating film having a predetermined etching ratio to the dummy gate; forming a second insulating film above the semiconductor substrate, the second insulating film having a predetermined etching ratio to the first insulating film; processing the second insulating film, thereby giving a substantially flat surface thereto and burying the dummy gate and the first insulating film in the second insulating film; removing a part of the first insulating film to leave the remaining part of the first insulating film at a prescribed height, the remaining part contacting the circumferential surface of the dummy gate; removing the dummy gate and the dummy-gate insulating film above the channel region, thereby making a trench surrounded by the second insulating film and the first insulating film; forming a gate insulating film on the channel region; and filling the trench with metal, thereby forming a gate electrode.

DETAILED DESCRIPTION OF THE INVENTION

An embodiment of the present invention will be described in detail, with reference to the accompanying drawings.

FIGS. 2A to 2I are sectional views, explaining a method of manufacturing a CMOS LSI. More precisely, FIGS. 2A to 2I explain the damascene metal-gate process performed to make the gate electrode of one of the MOSFETs incorporated in the CMOS LSI.

Figure 1A:
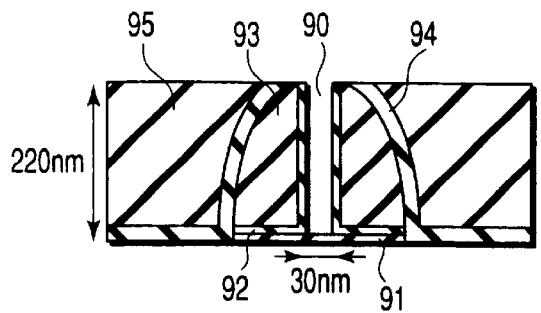
FIGS. 1A and 1B are sectional views explaining a method of manufacturing a conventional MOSFET.
Figure 1B:
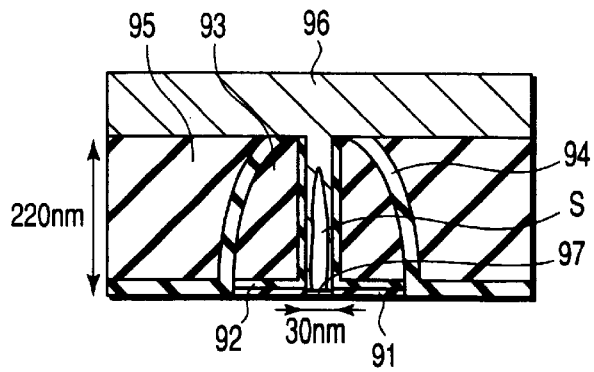
Figure 2A:
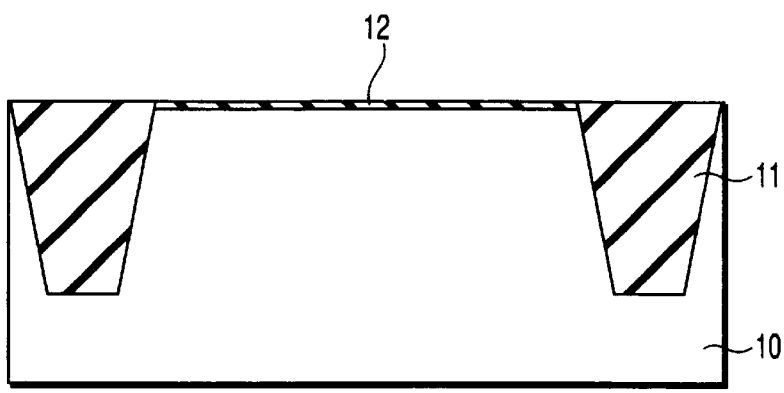
FIGS. 2A to 2I are sectional view explaining a method of manufacturing a CMOS LSI according to an embodiment of the present invention.

As FIG. 2A shows, an element-isolating region 11 is formed in the surface of a silicon substrate 10. The element-isolating region 11 surrounds a part the silicon substrate 10, or an active region. A dummy-gate oxide film 12 is formed in the surface of the active region, to a thickness of, for example, 10 nm. The element-isolating structure, thus provided, achieves shallow trench isolation (STI). Nonetheless, the shallow trench isolation may be replaced by local oxidization (LOCOS) or any other element-isolating technique.

To provide a CMOS structure, phosphorus, for example, is ion-implanted at acceleration voltage of 500 keV into the n-well region of the substrate 10, and boron, for example, is ion-implanted at acceleration voltage of 300 keV into the p-well region of the substrate 10. Thereafter, the resultant structure is subjected to activation annealing at 1000° C. for one minute. The impurity ions implanted into the well regions are thereby diffused, forming an n-well and a p-well (either not shown).

Figure 2B:
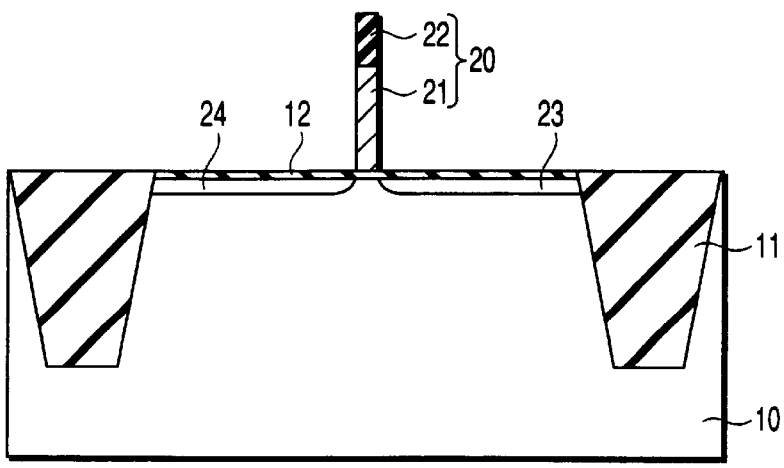

As shown in FIG. 2B, a polycrystalline silicon film 21 is formed on the wafer, thereby to form a dummy gate 20. The polycrystalline silicon film 21 has a thickness of, for example, 150 nm. An insulating film having a prescribed etching ratio to the film 21, for example, a first silicon nitride film 22 is deposited on the polycrystalline silicon film 21 by reduced-pressure CVD (Chemical Vapor Deposition). The first silicon nitride film 22 has a thickness of, for example, 70 nm. Next, the first silicon nitride film 22 is subjected to selective etching affected by photolithography. Then, the polycrystalline silicon film 21 is subjected to selective etching. A dummy gate 20 is thereby formed. The dummy gate 20 is composed of two layers, the upper one of which is made of the first silicon nitride film 22.

Thereafter, arsenic ions are implanted into an nMOSFET region of the substrate 10 by means of low-acceleration ion implantation. Similarly, boron ions are implanted into a pMOSFET region of the substrate 10 by means of low-acceleration ion implantation. Activation annealing is performed on the resultant structure, at 900° C. for one second. A source extension region 23 and a drain extension region 24 are thereby formed in the surface of the substrate 10. Both extension regions 23 and 24 have a shallow junction. A MOSFET channel region is formed in that surface region of the substrate 10 which lies between the source extension region 23 and the drain extension region 24. Note that the extension regions 23 and 24 contacts, at one end, the MOSFET channel region. To form the extension regions 23 and 24, those parts of the dummy-gate oxide film 12 which lie on the regions 23 and 24 may be removed by applying a diluted hydrofluoric acid, and low-acceleration ion implantation may then be carried out.

Figure 2C:
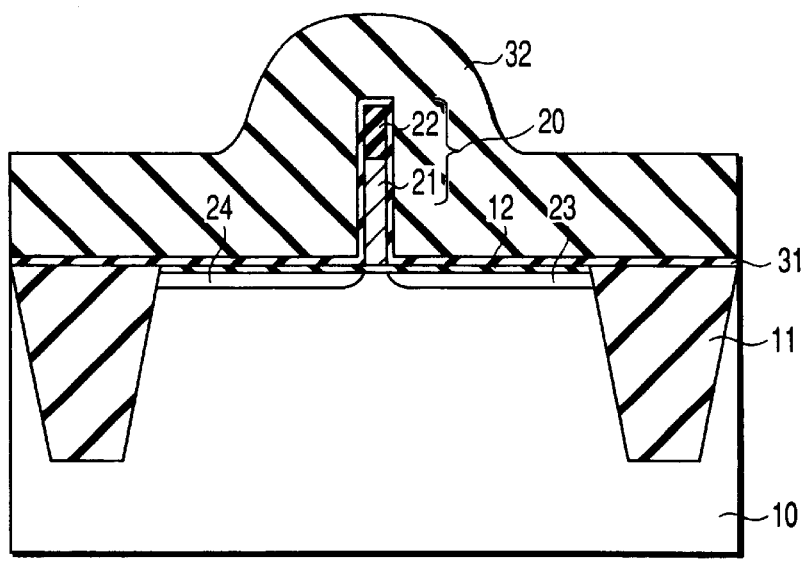

As shown in FIG. 2C, an insulating film, such as second silicon nitride film 31, which has a predetermined etching ratio to the polycrystalline silicon film 21 (i.e., the layer provided below the dummy gate 20), is deposited on the wafer by reduced-pressure CVD. The second silicon nitride film 31 has a thickness of, for example, 10 nm. Then, a silicon oxide film 32 is deposited on the second silicon film 31 by reduced-pressure CVD, to a thickness of 100 nm.

Figure 2D:
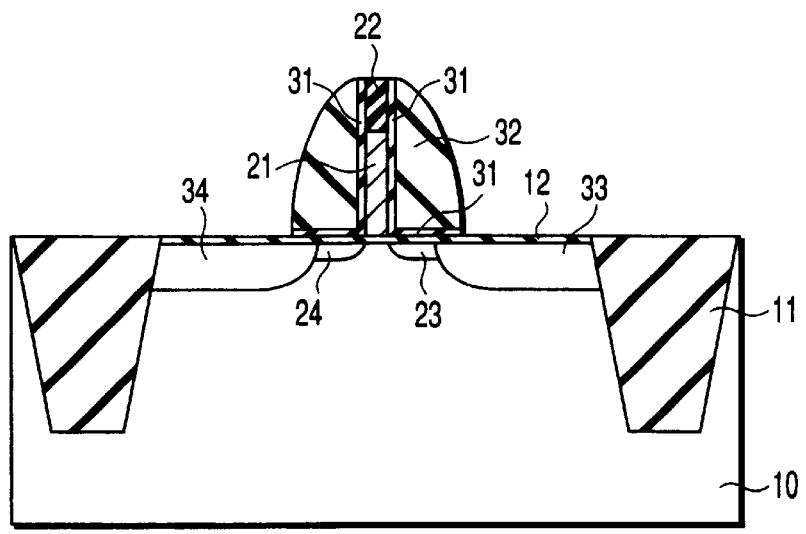

Next, anisotropic etching, such as reactive ion etching (RIE), is performed, removing the silicon oxide film 32, except for the parts that lie on the sides of the dummy gate 20, as is illustrated in FIG. 2D. At the same time, the second silicon nitride film 31 is removed, too, except for the those parts of the silicon oxide film 32 which lie below the silicon oxide films 32 left on the sides of the dummy gate 20.

Thereafter, arsenic ions are implanted into the nMOSFET region, and boron ions are implanted into the pMOSFET region. Activation annealing is then carried out at 950° C. for one second. A source region 33 and a drain region 34, each having a deep junction, are thereby formed in the surface of the substrate 10.

Figure 2E:
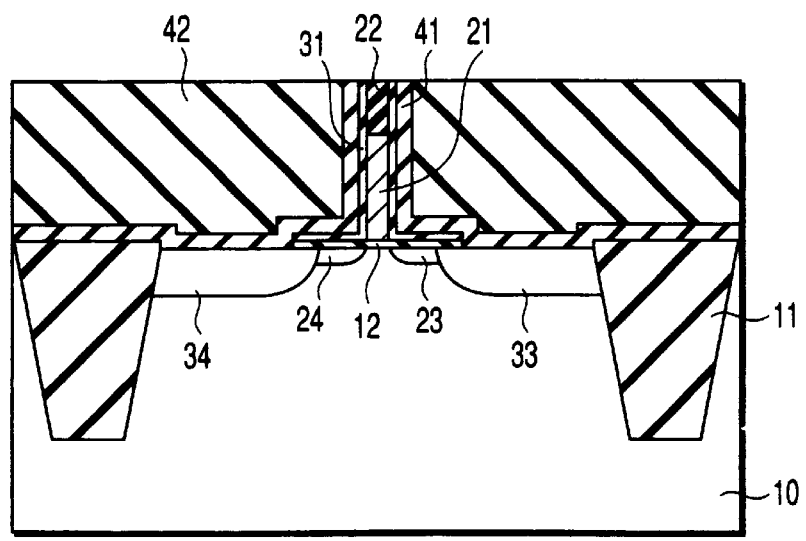

As shown in FIG. 2E, diluted hydrofluoric acid is applied, removing the silicon oxide films 32 from the side-walls of the dummy gate 20. At this time, the dummy-gate oxide film 12 is removed, except for that part lying below the second silicon nitride film 31 that, in turn, lies below the silicon oxide film 32. A third silicon nitride film 41 is deposited on the surface of the structure. This silicon nitride film 41 has a thickness of, for example, 20 nm and will be used as stopper insulating film when a contact hole is formed to expose a silicon oxide film 42. The silicon oxide film 42, i.e., insulating film that has a specific etching ratio to the second silicon nitride film 31, is deposited by CVD to a thickness of, for example, 400 nm. The upper surface of the resultant structure is made flat by CMP. The first to third silicon nitride films 22, 31 and 41 are thereby exposed.

As indicated above, the insulating films having specific etching ratios to the polycrystalline silicon film 21 (layer provided beneath the dummy gate 29), i.e., the second silicon nitride film 31 and the third silicon nitride film 41, cover the surface and sides of the dummy gate 20 before and after the forming of the source region 33 and drain region 34. Instead, only the second silicon nitride film 31 or the third silicon nitride film 41 may be covered before or after the forming of the source region 33 and drain region 34.

Figure 2F:
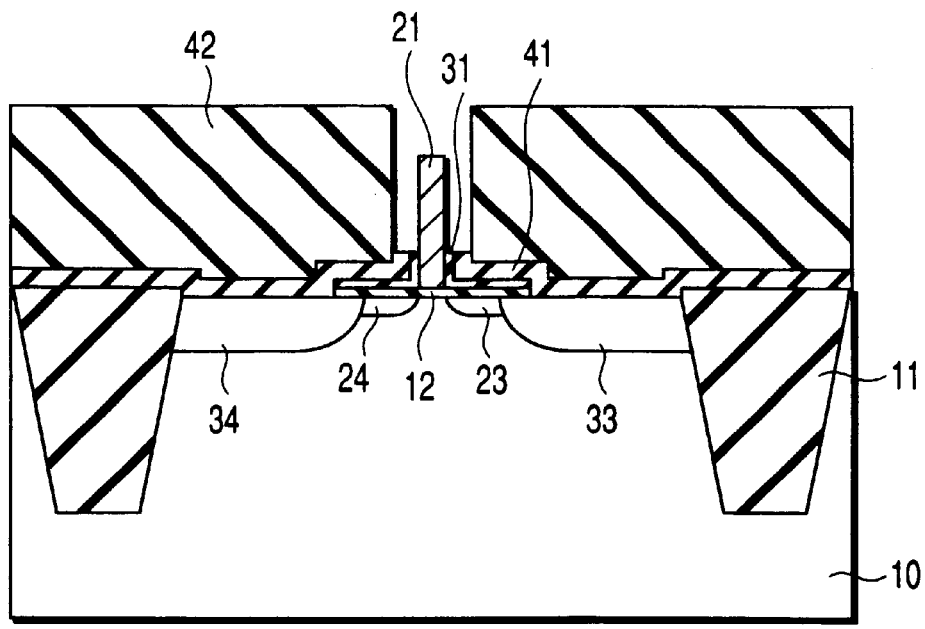

Then, as illustrated in FIG. 2F, the first to third silicon nitride films 22, 31 and 41, all exposed, are etched with an etchant exhibiting a particular etching rate to the silicon oxide film 42, such as hot phosphoric acid. It is important to control the etching rates of the second and third silicon nitride films 31 and 41, so that the dummy-gate oxide film 12 lying below the second nitride film 31 may not be etched and that those parts of the films 31 and 41 which lie on the sides of the dummy gate 20 remain thicker than other parts.

Figure 2G:
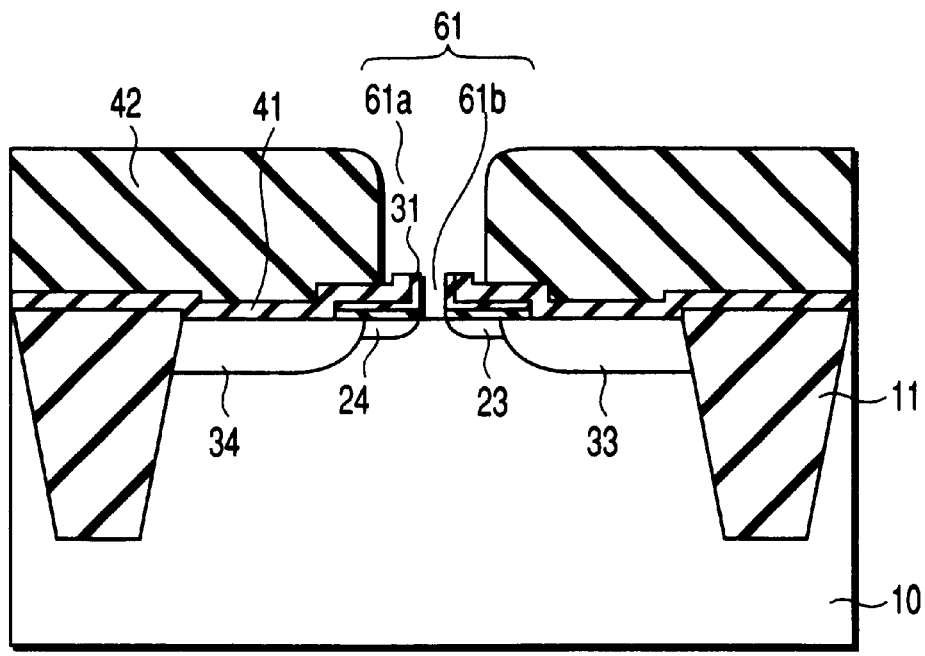

As shown in FIG. 2G, the polycrystalline silicon film 21 lying beneath the dummy gate 20 and that part of the dummy-gate oxide film 12 which lies on the channel region, or between the drain and source regions, is removed, which the silicon nitride films 31 and 41 remains. A trench 61 is thereby made in the oxide film 12 and the silicon nitride films 31 and 41. The trench 61 consists of a first part 61a and a second part 61b, which are surrounded by the silicon oxide film 42 and the silicon nitride film 31, respectively.

The polycrystalline silicon film 21 and said part of the dummy-gate oxide film 12 are removed by means of isotropic etching. The first part 61a of the trench 61 is therefore broadened at the same time the dummy gate film 12 is removed from the channel region.

Ion implantation is performed on the nMOSFET channel region and the pMOSFET channel region, thereby to control a threshold voltage of the nMOSFET and the pMOSFET.

Figure 2H:
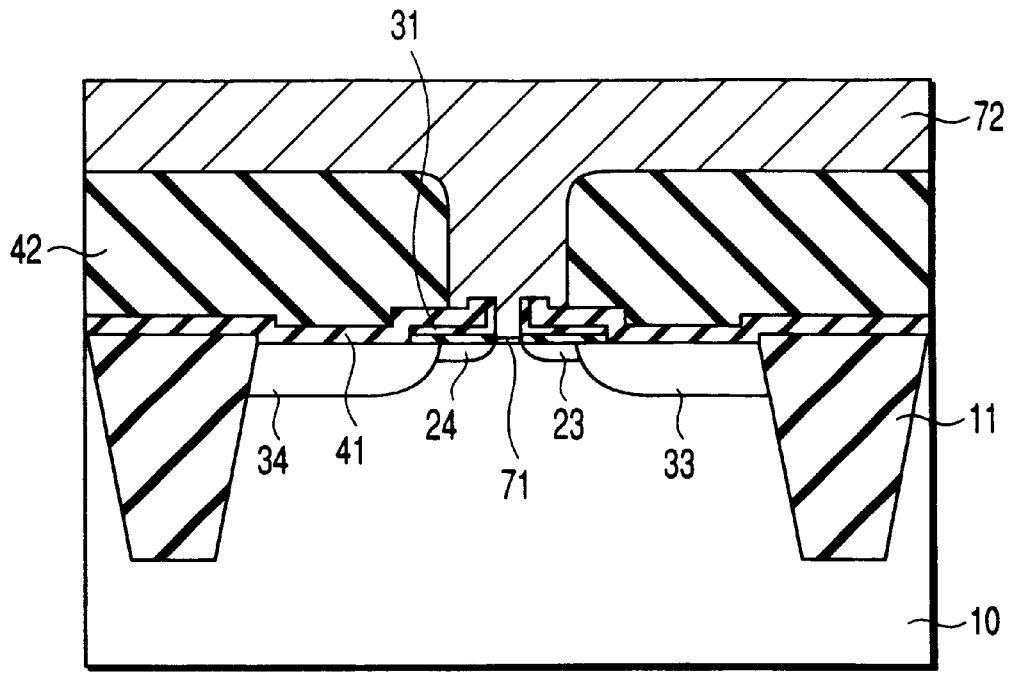

As FIG. 2H shows, a gate insulating film 71 is deposited on the channel region by CVD. A metal layer, such as Ta layer 72 is deposited on the entire structure by means of sputtering. The trench 61 is thereby filled with Ta. The first part 61a and second part 61b of the trench 61, which are surrounded by the silicon oxide film 42 and the second silicon nitride film 31, respectively, have aspect ratios of 3 or less. Hence, the trench 61 can be completely filled with Ta when the Ta layer 72 is deposited by sputtering.

Figure 2I:
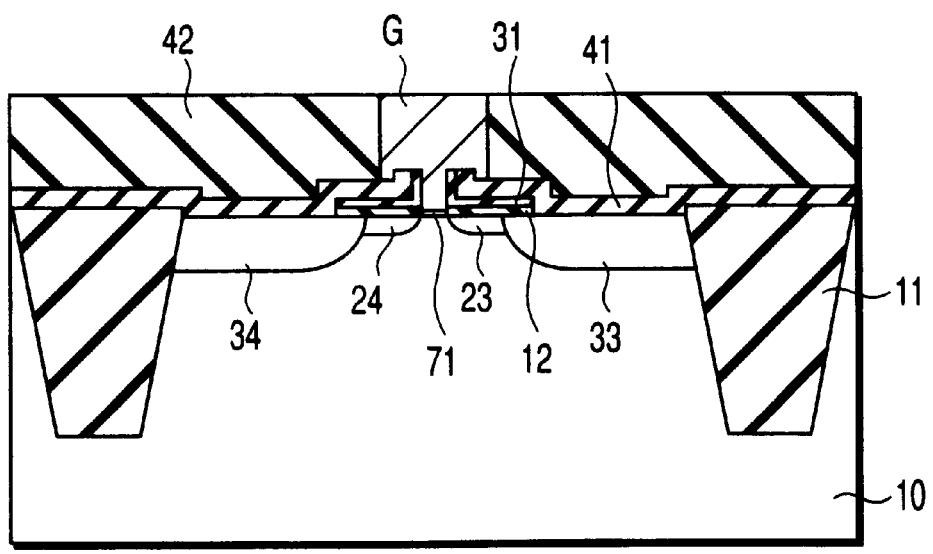

As shown in FIG. 2I, the Ta layer 72 is removed from the surface of the silicon oxide film 42, but not from the trench 61, by CMP. A gate electrode G is thereby formed. Thereafter, wiring layers are formed in the ordinary CMOS-manufacturing steps.

In the method described above, the silicon nitride films 31 and 41 and the silicon oxide film 42, which covers the sides of the dummy gate 20, are etched, broadening the upper part 61a of the trench 61. This renders it easy to fill the trench 61 with metal 72, helps to lower the resistance of the gate electrode G, and prevents an increase in the gate length. Thus, unlike the conventional method, the method of this invention can employ the damascene metal-gate process in the manufacture of a high-performance MOSFET having a short gate.

As seen from FIG. 2I, the gate electrode G is composed of a lower part and an upper part. The lower part has a lower surface and sides. The upper part has a lower surface. The upper part of the gate electrode G is longer than the lower part, as measured in the lengthwise direction of the gate. Two or more insulating films, including the silicon nitride films 31 and 41, are provided between the upper surface of the gate electrode G and the semiconductor substrate 10. The silicon nitride film 31 is composed of two parts. The first part extends vertically and contacts a lower side of the gate electrode G. The second part extends horizontally and is provided on the dummy-gate oxide film 31. The second part of he silicon nitride film 31 is vertically aligned with the source extension region 23 and drain extension region 24.

The two or more insulating films provided between the lower surface of the upper part of the gate electrode G and the semiconductor substrate 10, including the silicon nitride films 31 and 41, have parts located adjacent to the sides of the lower part of the gate electrode G. These parts of the insulating films have a height greater than a height of the other parts located between the lower surface of the upper part of the gate electrode G and the semiconductor substrate 10.

Since these parts of the silicon nitride silicon films 31 and 41 have a height greater than a height of the other parts, the gate-source coupling capacitance between the gate electrode G and the source region is small. For the same reason, the gate-drain coupling capacitance between the gate electrode G and the drain region is small, too. Since the gate-source coupling capacitance and the gate-drain coupling capacitance are small, the MOSFET can operate at high speeds.

The third silicon nitride film 41 may not be provided if the second silicon nitride film 31 is formed sufficiently thick.

The gate electrode G may be made of Mo, W, Nb, Ta, Zr, Hf, Ti, Pt, Ir, Sb, In, Ga, Ru, Sn, Te or Bi, a nitride or an alloy of any one of these metals. Furthermore, it can be made of a single-layer or multi-layer film of these materials. Further, the gate electrode G of the nMOSFET and the gate electrode G of the pMOSFET may be made of different materials.

The smaller the MOSFETs formed on a semiconductor substrate, the thinner the gate insulating film of each MOSFET. If the gate insulating film is of 1.5 nm or less thick, a large gate leakage current resulting from a direct tunnel current will flow. This increases the power consumed in the MOSFET. In some cases, this would deteriorate the operating characteristics of the MOSFET. To solve the problem that may occur in a small MOSFET due to the direct tunnel current, the gate insulating film 71 may be made of materials other than silicon oxide. It may be a single-layer or multi-layer film made of material having a high dielectric constant, such as hafnium oxide (HfxOy), zirconium oxide (ZrxOy), hafnium silicate, zirconium silicate or the like.

The semiconductor device according to the embodiment of the invention and the some modifications thereof, all described above, comprises: a semiconductor substrate 10; a pair of impurity-diffused layers formed, as the drain and source regions of a MISFET, in the surface of the substrate 10; a gate insulating film 71 provided on the channel region lying between the source and drain regions; a gate electrode G made of metal and having a lower part contacting the gate insulating film 71 and an upper part longer than the lower part as measured in the lengthwise direction of the gate; and the first insulating film 31 or 41 interposed between the lower surface of the upper part of the gate electrode G and the semiconductor substrate 10 and surrounding the sides of the lower part of the gate electrode G. That part of the first insulating film 31 or 41, which contact the sides of the gate electrode G, are thicker than other parts.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

preparing a semiconductor substrate;

forming a dummy-gate insulating film and a dummy gate having a circumferential surface, on a region of said semiconductor substrate, in which an insulated gate field-effect transistor will be formed;

introducing an impurity into a surface of said semiconductor substrate selectively, thereby forming a drain region and a source region of said insulated gate field-effect transistor and forming a channel region between said drain region and said source region;

forming a first insulating film on said circumferential surface of said dummy gate, said first insulating film having a predetermined etching ratio to said dummy gate;

forming a second insulating film above said semiconductor substrate, said second insulating film having a predetermine etching ratio to said first insulating film;

processing said second insulating film, thereby giving a substantially flat surface thereto and burying said dummy gate and said first insulating film in said second insulating film;

removing a part of said first insulating film to leave the remaining part of said first insulating film at a prescribed height, said remaining part contacting said circumferential surface of said dummy gate;

removing said dummy gate and said dummy-gate insulating film above said channel region, thereby making a trench surrounded by said second insulating film and said first insulating film;

forming a gate insulating film on said channel region; and wherein said forming of said first insulating film includes forming a first silicon nitride film above an entire surface of said semiconductor substrate after forming a first pair of impurity-diffused layers in said drain and source regions, respectively;

forming an oxide film at a side-wall of said dummy gate;

removing a portion of said first silicon nitride film, which is not covered with said oxide film, removing said oxide film after introducing an impurity into a surface of said semiconductor substrate selectively, by using said dummy gate and said oxide film as a mask, to form a second pair of impurity-diffused layers in said drain and source regions, respectively, and forming a second silicon nitride film above an entire surface of said semiconductor substrate.

2. The method according to claim 1, wherein said dummy-gate insulating film is removed by isotropic etching, and said trench surrounded by said second insulating film is broadened during said isotropic etching.

3. The method according to claim 1, wherein said first insulating film includes a silicon nitride film, and said second insulating film is a silicon oxide film.

4. The method according to claim 1, wherein said dummy gate comprises a plurality of layers, laid one upon another, an uppermost of which is a third silicon nitride film, and a part of said first insulating film is removed when said third silicon nitride film is removed.

5. The method according to claim 1, wherein a part of said first insulating film, which contacts said circumferential surface of said dummy gate, is left higher than the other part after a part of said first insulating film is removed.

6. The method according to claim 1, wherein said gate electrode is a single-layer or multi-layer film made of Mo, W, Nb, Ta, Zr, Hf, Ti, Pt, Ir, Sb, In, Ga, Ru, Sn, Te or Bi, a nitride or an alloy of any one of these metals.

7. The method according to claim 1, wherein said gate insulating film is a single-layer or multi-layer film made of a material selected from the group consisting of silicon oxide, hafnium oxide, zirconium oxide, hafnium silicate and zirconium silicate.

8. The method according to claim 1, wherein said forming of said first insulating film comprises:

forming a silicon nitride film above an entire surface of said semiconductor substrate;

forming an oxide film at side-wall of said dummy gate; and removing a portion of said silicon nitride film, which is not covered with said oxide film.

9. The method according to claim 1, wherein said forming of said first insulating film comprises:

forming a silicon nitride film above an entire surface of said semiconductor substrate after removing a side-wall of said dummy gate, which are used jointly with said dummy gate as a mask through which an impurity is introduced into a surface of said semiconductor substrate selectively, to form said drain and source regions.

* * * * *

UNITED STATES PATENT AND TRADEMARK OFFICE
CERTIFICATE OF CORRECTION

PATENT NO. : 6,649,462 B2
DATED : November 18, 2003
INVENTOR(S) : Azuma et al.

It is certified that error appears in the above-identified patent and that said Letters Patent is hereby corrected as shown below:

Column 6,
Line 57, change "predetermine" to -- predetermined --.

Signed and Sealed this

Sixteenth Day of March, 2004

JON W. DUDAS
*Acting Director of the United States Patent and Trademark Office*